United States Patent
Salato et al.

(10) Patent No.: US 8,193,786 B2
(45) Date of Patent: Jun. 5, 2012

(54) DRIVING CIRCUIT FOR DEPLETION MODE SEMICONDUCTOR SWITCHES

(75) Inventors: Maurizio Salato, Torrance, CA (US); Marco Soldano, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/081,744

(22) Filed: Apr. 7, 2011

(65) Prior Publication Data

US 2011/0181252 A1 Jul. 28, 2011

Related U.S. Application Data

(63) Continuation of application No. 11/402,109, filed on Apr. 11, 2006, now Pat. No. 7,928,702.

(60) Provisional application No. 60/670,829, filed on Apr. 13, 2005, provisional application No. 60/680,629, filed on May 13, 2005.

(51) Int. Cl.
*G05F 1/618* (2006.01)
*G05F 3/16* (2006.01)

(52) U.S. Cl. .......... 323/224; 323/282; 323/289; 361/18

(58) Field of Classification Search .............. 361/18; 323/222–225, 271, 282, 285, 289
See application file for complete search history.

(56) References Cited

U.S. PATENT DOCUMENTS

| | | | |
|---|---|---|---|
| 6,359,797 B1* | 3/2002 | Bayer et al. | 363/60 |
| 6,989,659 B2* | 1/2006 | Menegoli et al. | 323/274 |
| 7,026,797 B2* | 4/2006 | McCune, Jr. | 323/225 |
| 7,385,375 B2* | 6/2008 | Rozman | 323/224 |
| 7,863,877 B2* | 1/2011 | Briere | 323/282 |
| 2004/0046532 A1* | 3/2004 | Menegoli et al. | 323/273 |
| 2006/0198173 A1* | 9/2006 | Rozman | 363/123 |
| 2007/0170897 A1* | 7/2007 | Williams | 323/222 |
| 2008/0136390 A1* | 6/2008 | Briere | 323/282 |
| 2008/0186004 A1* | 8/2008 | Williams | 323/282 |
| 2008/0191679 A1* | 8/2008 | Williams | 323/282 |
| 2008/0197908 A1* | 8/2008 | Williams | 327/431 |
| 2008/0284516 A1* | 11/2008 | Bradbury | 330/277 |

FOREIGN PATENT DOCUMENTS

JP 2008235952 A * 10/2008

* cited by examiner

*Primary Examiner* — Eduardo Colon Santana
(74) *Attorney, Agent, or Firm* — Farjami & Farjami LLP

(57) ABSTRACT

A driving circuit for a half bridge utilizing bidirectional semiconductor switches in accordance with an embodiment of the present application includes a high side driver operable to control a high side bidirectional semiconductor switch, wherein the high side driver provides a negative bias voltage to the bidirectional semiconductor switch to turn the high side bidirectional semiconductor switch OFF. A low side driver may be operable to control a low side bidirectional semiconductor switch. An external voltage source with a negative terminal of the voltage source connected to the high side driver may be provided. A high side driving switch may be positioned between the negative terminal of the voltage source and the high side driver and operable to connect the high side driver to the negative terminal of the voltage source when the low side driver turns the low side bidirectional semiconductor switch ON.

10 Claims, 11 Drawing Sheets

DRIVING CIRCUIT FOR DEPLETION MODE SEMICONDUCTOR SWITCHES

This is a continuation of application Ser. No. 11/402,109 filed Apr. 11, 2006 now U.S. Pat. No. 7,928,702.

CROSS-REFERENCE TO RELATED APPLICATIONS

The present application claims benefit to and priority from U.S. Provisional Patent Application No. 60/670,829 entitled DRIVING CIRCUITS AND TECHNIQUES FOR HIGH VOLTAGE, BIDIRECTIONAL SEMICONDUCTOR SWITCHES filed Apr. 13, 2005, the entire contents of which are hereby incorporated by reference herein.

The present application also claims benefit and priority from U.S. Provisional Patent Application No. 60/680,629 entitled DRIVING CIRCUIT AND TECHNIQUE FOR HIGH VOLTAGE BIDIRECTIONAL SEMICONDUCTOR SWITCHES filed May 13, 2005, the entire contents of which are hereby incorporated by reference herein.

BACKGROUND OF THE INVENTION

1. Field of the Invention

The present invention relates to driving circuits and methods for use with high voltage bidirectional semiconductor switches. In particular, the present invention provides for a driving circuit that utilizes a bootstrap capacitor and a driving circuit with self supply from a DC bus.

2. Related Art

Recently developed bidirectional III-nitride switches are particularly useful in the field of high power and high frequency electronics. A bidirectional III-nitride switch typically includes a substrate which may be composed of Si, SiC, Sapphire, or the like, a first semiconductor body formed over the substrate comprised of gallium Nitride (GaN), and a second semiconductor body formed over first semiconductor body and composed of AlGaN. The heterojunction of GaN and AlGaN produces a highly conductive two-dimensional electron gas (2DEG) at or near the heterojunction. The 2DEG is formed due to the spontaneous polarization effect as is known in the art. Two Ohmic power electrodes are ohmically connected to the second semiconductor body (AlGaN). Two gate electrodes may be positioned a predetermined distance from each of the two ohmic resistors. The bidirectional III-nitride switch described above is a depletion mode device in that it is normally ON. The application of an appropriate voltage to either of the gates, however, causes an interruption of the 2DEG which turns the switch OFF. Generally, the voltage that is applied to the gate or gates to turn the switch OFF is a voltage that is more negative than the potential at either of the ohmic electrodes. Additional and non-limiting examples of bidirectional switches can be found in U.S. Patent Publication No. 2005/0189561 entitled III-NITRIDE BIDIRECTIONAL SWITCH, filed on Feb. 11, 2005 in the names of Daniel M. Kinzer and Robert Beach and assigned to the assigned of the present application, the contents of which are hereby incorporated by reference.

The bidirectional switches discussed above are particularly useful for use in high voltage, high frequency systems and as such are useful for most any power electronics application over a wide range of topologies.

However, given the somewhat unique characteristics of these switches as depletion mode devices, it is desirable to provide improved driving circuits and methods to control these switches.

SUMMARY OF THE INVENTION

A driving circuit for a half bridge utilizing bidirectional semiconductor switches in accordance with an embodiment of the present application includes a high side driver operable to control a high side bidirectional semiconductor switch, wherein the high side driver provides a negative bias voltage to the bidirectional semiconductor switch to turn the high side bidirectional semiconductor switch OFF, a low side driver operable to control a low side bidirectional semiconductor switch, an external voltage source wherein the a negative terminal of the voltage source is connected to the high side driver; and a high side driving switch, positioned between the negative terminal of the voltage source and the high side driver and operable to connect the high side driver to the negative terminal of the voltage source when the low side driver turns the low side bidirectional semiconductor switch ON.

A driving circuit for a half bridge utilizing bidirectional semiconductor switches in accordance with another embodiment of the present application includes a high side driver operable to control a high side bidirectional semiconductor switch, wherein the high side driver includes a linear regulator control device that selectively connects the high side driver to a lower rail of the half bridge and a low side driver operable to control a low side bidirectional semiconductor switch.

Other features and advantages of the present invention will become apparent from the following description of the invention which refers to the accompanying drawings.

DETAILED DESCRIPTION OF EMBODIMENTS OF THE INVENTION

One of the advantages of using double gated bidirectional semiconductor switches such as those described above, with regard to the topology of accompanying driving circuits is the possibility of having fully equivalent gates each referred to a device source. For example in the specific circuit illustrated in FIG. 1, a gate of a bidirectional semiconductor switching device (108 or 110) is referenced to the positive DC bus rail (VBUS), the negative DC bus rail (RTN) and the half bridge output (node 103).

Further, given the fact that bidirectional semiconductor switches are depletion mode devices which are normally ON and typically require a negative bias on at least one gate in order to be turned OFF, new driving topologies are possible.

Figure 1:
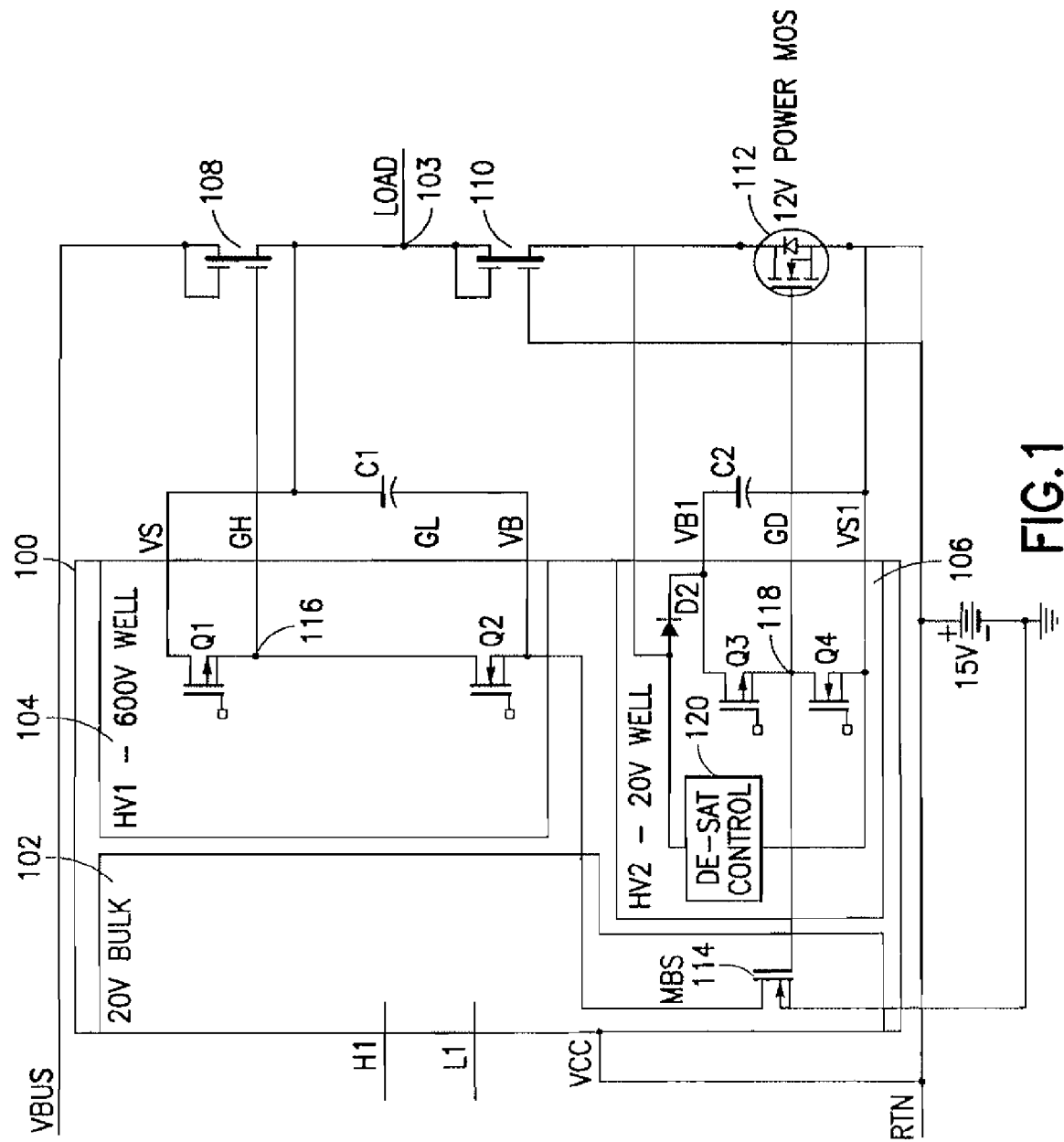
FIG. 1 illustrates a driving circuit for use with a half bridge circuit utilizing bidirectional switching devices in accordance with an embodiment of the present application.

The circuit of FIG. 1 illustrates a first topology of a driving circuit for a half bridge utilizing bidirectional semiconductor switches 108, 110 in accordance with an embodiment of the present invention.

As illustrated in FIG. 1, two bidirectional semiconductor devices, specifically a high side switch 108 and a low side switch 110 are arranged in series between the positive DC bus rail (VBUS) and negative, or lower, DC bus rail, or return rail (RTN). A node 103 is provided between the high side and low side switches 108, 110 at the output of the half bridge which is preferably coupled to a load (not shown).

A driving circuit 100 is provided to control the switches 108 and 110 of the half bridge. In the particular embodiment illustrated in FIG. 1, the driving circuit is implemented as an integrated circuit (IC) formed on a 20V bulk substrate 102 with 2 floating wells 104, 106. The first well (HV1) 104 preferably has a 600V capacity and includes components for driving the high side switch 108. The second well (HV2) 106 preferably has a 20V capacity.

The high side bidirectional switch 108 is preferably driven by a conventional output buffer formed by transistors Q1 and Q2 positioned in the first floating well 104. As illustrated, a node 116 is positioned between transistors Q1 and Q2 and is coupled to one of the gates of switch 108. The ON/OFF status of the transistors Q1 and Q2 is preferably determined based upon a high side input logic control signal HI which is connected to the circuit 100 via the bulk. It is noted that the IC circuit may also include appropriate level shifting and delay functions common to conventional driving circuits to ensure that the high side input logic control signal HI provide proper control.

In operation, the high side switch 108 is nominally ON and thus conducts to provide a voltage to the load via the output node 103 of the half bridge. During this time, the transistor Q2 is preferably OFF, and transistor Q1 is preferably ON. Thus no voltage is provided to the gate of the switch 108. The switch 108 remains ON since no voltage is applied to the gate connected to node 116 and the voltage at the other gate of the switch 108 is the same as that of the positive DC bus rail and thus no negative bias voltage applied either gate. When desired, the switch 108 may be turned OFF based on the high side logic signal HI. In particular, the switch Q2 is turned ON, and switch Q1 is turned off, such that a negative voltage is provide to the node 116 via the transistor Q2 and the high voltage MOSFET 114 (Mbs) from the negative terminal of voltage source 109. This negative voltage can then be applied to the lower gate of the switch 108, thus providing the negative bias to turn this switch OFF.

Just as in a conventional drive circuit for use with a conventional half bridge, the high side switch 108 and the low side switch 110 should not be ON at the same time. Thus, when the high side switch 108 is ON, the low side switch 110 should be OFF. Similarly, when the low side switch 110 is ON, the high side switch 108 is OFF. The high side logic input HI and low side logic input LI thus are provided to ensure that the switched 108 and 110 are never ON at the same time.

Thus, when the high side logic input HI drives the switch 108 OFF, the low side logic input LI preferably is used to turn the low side switch 110 ON. It is noted however, that the IC 100 may also be provided with an appropriate dead time (DT) to ensure that the high side and low side switches 108 and 110 are not ON at the same time during the transition. The use of such a preset dead time is common in driving circuits. The low side switch 110 is preferably controlled by cascoded switching. That is, power MOSFET 112 is placed in series between the switch 110 and the lower rail of the DC bus. The top gate of the switch 110 is coupled to the top electrode thereof, and thus will not provide a negative bias relative to the top electrode. The bottom gate of the switch 110 is coupled to the lower DC BUS rail, or return rail RTN. Thus, the potential applied to the lower gate will be substantially constant. However, the low side input logic LI is preferably used to control the output buffer formed by transistors Q3 and Q4 in the second well 106. Again, appropriate level shifting and delays may be incorporated into the IC 100 to ensure that the low side input logic LI provides appropriate control. A node 118 is provided between the transistors Q3 and Q4 to provide a voltage to turn the power MOSFET 11 ON and OFF. When the power MOSFET is ON, the relationship of the potential applied to the gates of switch 110 is such that the switch 110 stays on. When the power MOSFET 110 is turned OFF however, the voltage at the low side electrode of the switch 110 will change such that the switch 110 is turned OFF.

As illustrated, the node 118 also controls the high voltage MOSFET 114 as well, such that the High voltage MOSFET is only ON when the power MOSFET 112 is ON. In particular, it is preferable if there is a slight delay between the turning ON of the power MOSFET 112 and the turning ON of the high voltage MOSFET such that the high voltage MOSFET 114 turns on only after the power MOSFET 112 is already ON. Similarly, it is preferable that the high voltage MOSFET 114 turn OFF before the power MOSFET 112 turns OFF.

In addition, a desaturation control device 120 is provided to ensure that the power MOSFET 112 remains unsaturated. This feature is desirable in order to ensure that control of the power MOSFET will result in control of the lower switch 110.

The only external components used by the IC 100 are the two capacitors C1 and C2 and the single Diode D2. It is noted that the Diode D2 may also be incorporated into the IC if desired. This may be preferable in order to more easily provide short circuit protection, current sensing or temperature sensing.

In addition, it is noted also that using the configuration illustrated in FIG. 1, the capacitor C1 can be charged via the low side switch 110, the power MOSFET 112 and the high voltage MOSFET 116 when the high side switch 108 is turned OFF.

Figure 2:
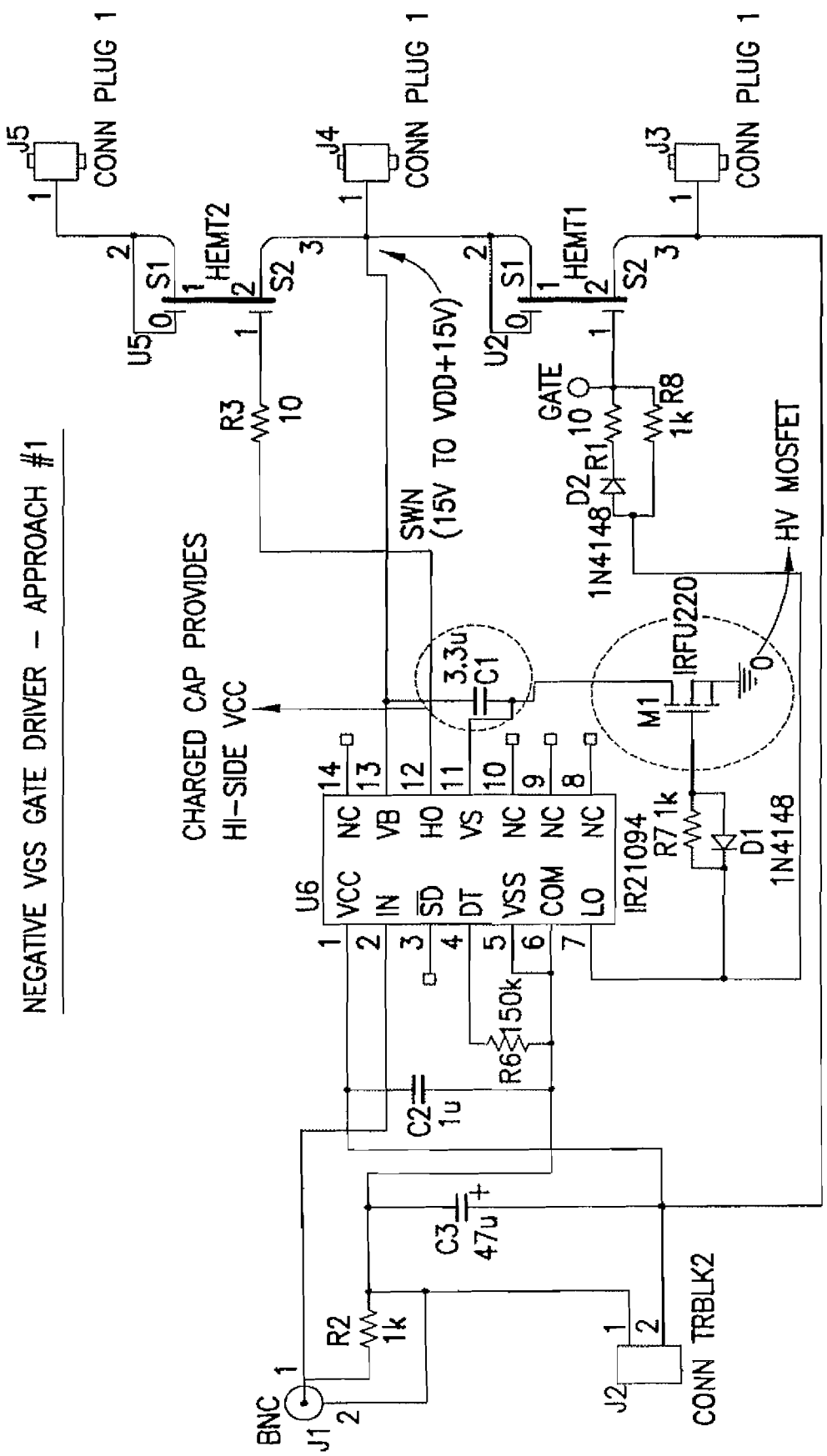
FIG. 2 is a schematic illustration of a simulation circuit used to simulate the circuit of FIG. 1.

FIG. 2 is an illustration of a circuit used to simulate the circuit illustrated in FIG. 1. The circuit of FIG. 2 utilizes a half bridge driver chip such as the IR2109(4) manufactured by International Rectifier Corporation to substantially provide the components of the integrated circuit 100 described above. The function and layout of the IR2109(4) is well known and publicly documented and thus will not be described in detail herein. It will be understood, however, that other functionally equivalent driver chips may also be used.

As illustrated in FIG. 2 the external capacitors C1 and C2 are connected between appropriate pins of the chip. The transistor M1 illustrated in FIG. 2 and labeled HV MOSFET corresponds to the high voltage MOSFET 114 of FIG. 1. Bidirectional semiconductor switches HEMT2 and HEMT1 correspond to the bidirectional switches 108 and 110 of FIG. 2. The additional components illustrated in FIG. 2 include modifications and adaptations necessary for testing.

Figure 3:
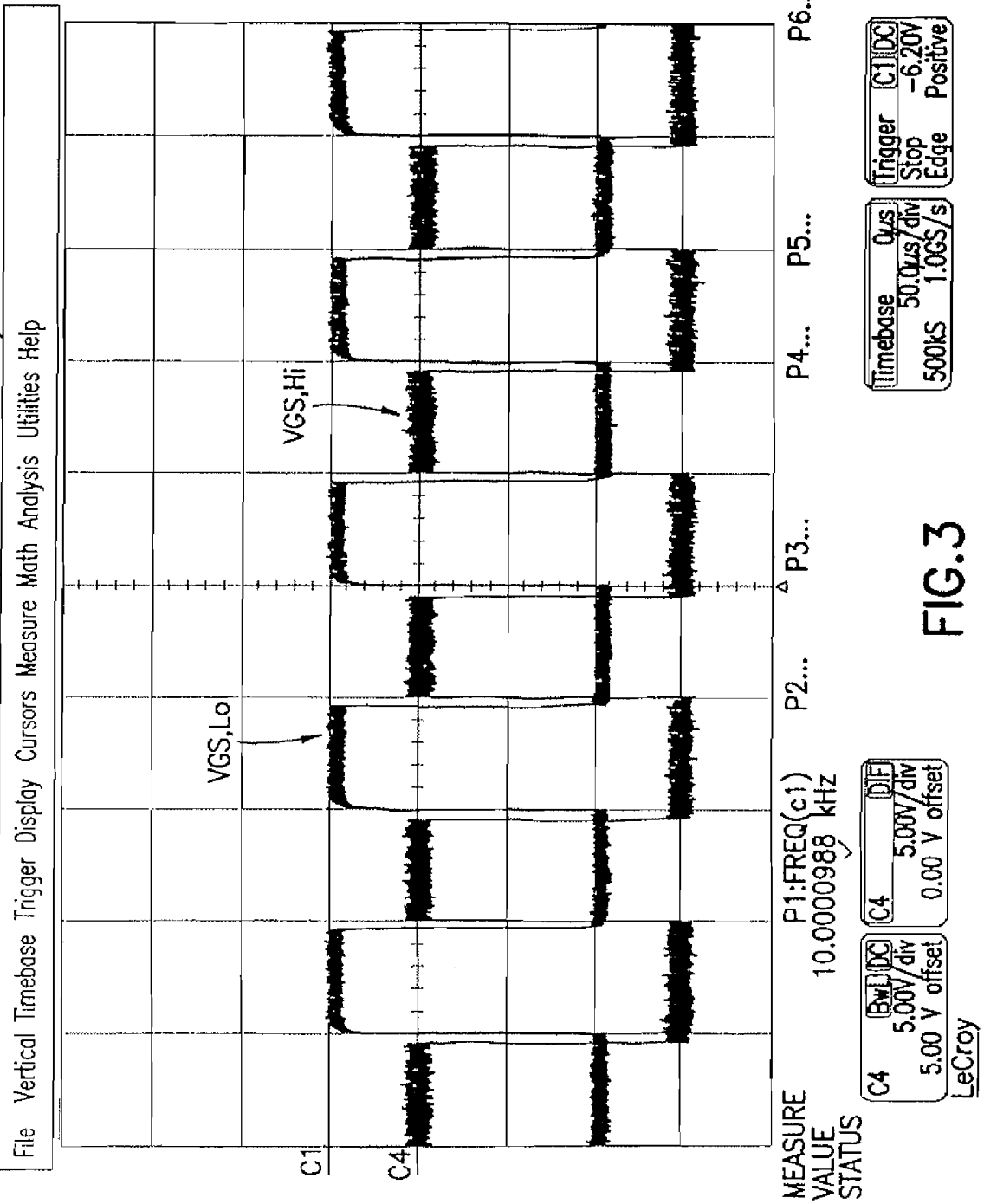
FIG. 3 is a chart illustrating measured gate-source voltages of the switching devices illustrated in the simulation circuit of FIG. 2.

FIG. 3 is a chart illustrating measured values of the gate-source voltages (VGS) for the high side and low side switches HEMT2, HEMT1 in FIG. 2. As illustrated the gate-source voltages for both switched transition between positive and negative values such that they would be capable of turning the bidirectional switches ON and OFF as necessary.

Figure 4:
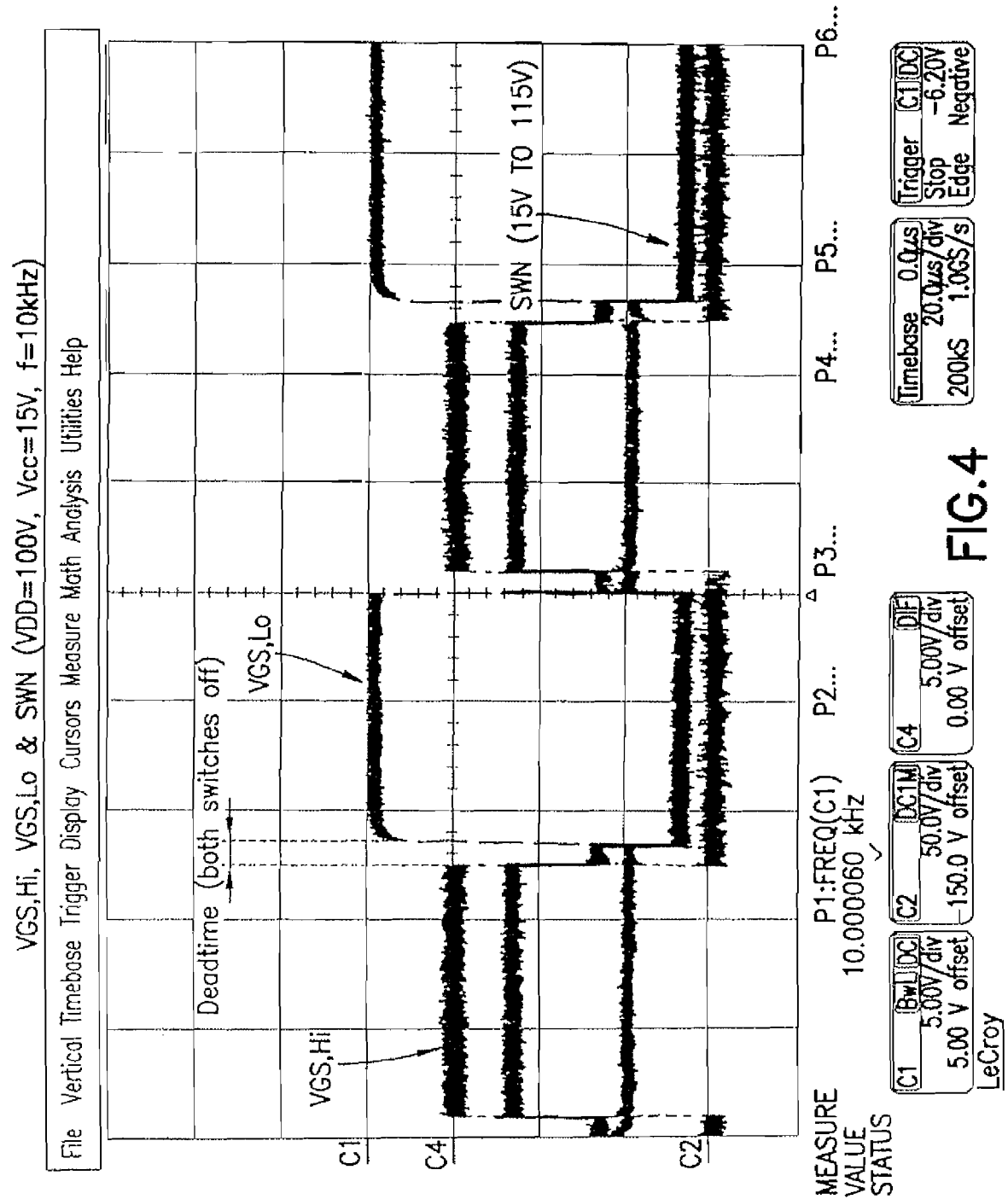
FIG. 4. Is a chart illustrating measure gate-source voltages of the switching devices and illustrating the dead time during which both switched are off of the circuit of FIG. 2.

FIG. 4 is another chart illustrating measured values of the gate-source voltages (VGS) for the high side and low side switches HEMT2, HEMT1 in FIG. 2. FIG. 4 further highlights the dead time provide between changes in gate-source voltage in switches of FIG. 2 during which both switched are OFF. In addition the SWN is also illustrated.

Figure 5:
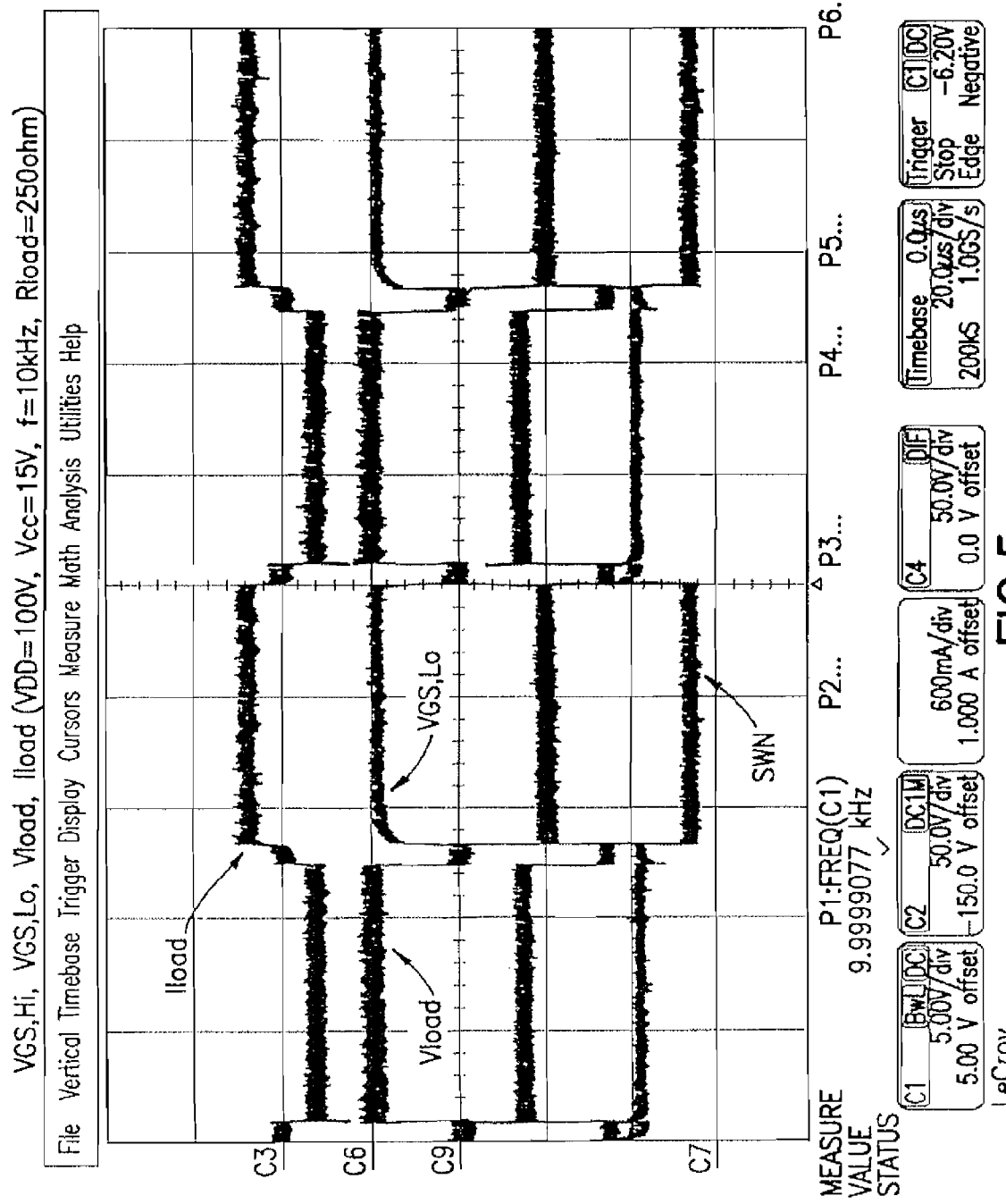
FIG. 5 is a chart illustrating the gate-source voltage of the switches of FIG. 2 and the load voltage and current.

FIG. 5 is a chart illustrates the measured values for the load current (Iload), the load voltage (Vload) and the gate source voltage of the low side switch (HEMTI) of FIG. 2) along with the measure SWN.

Figure 6:
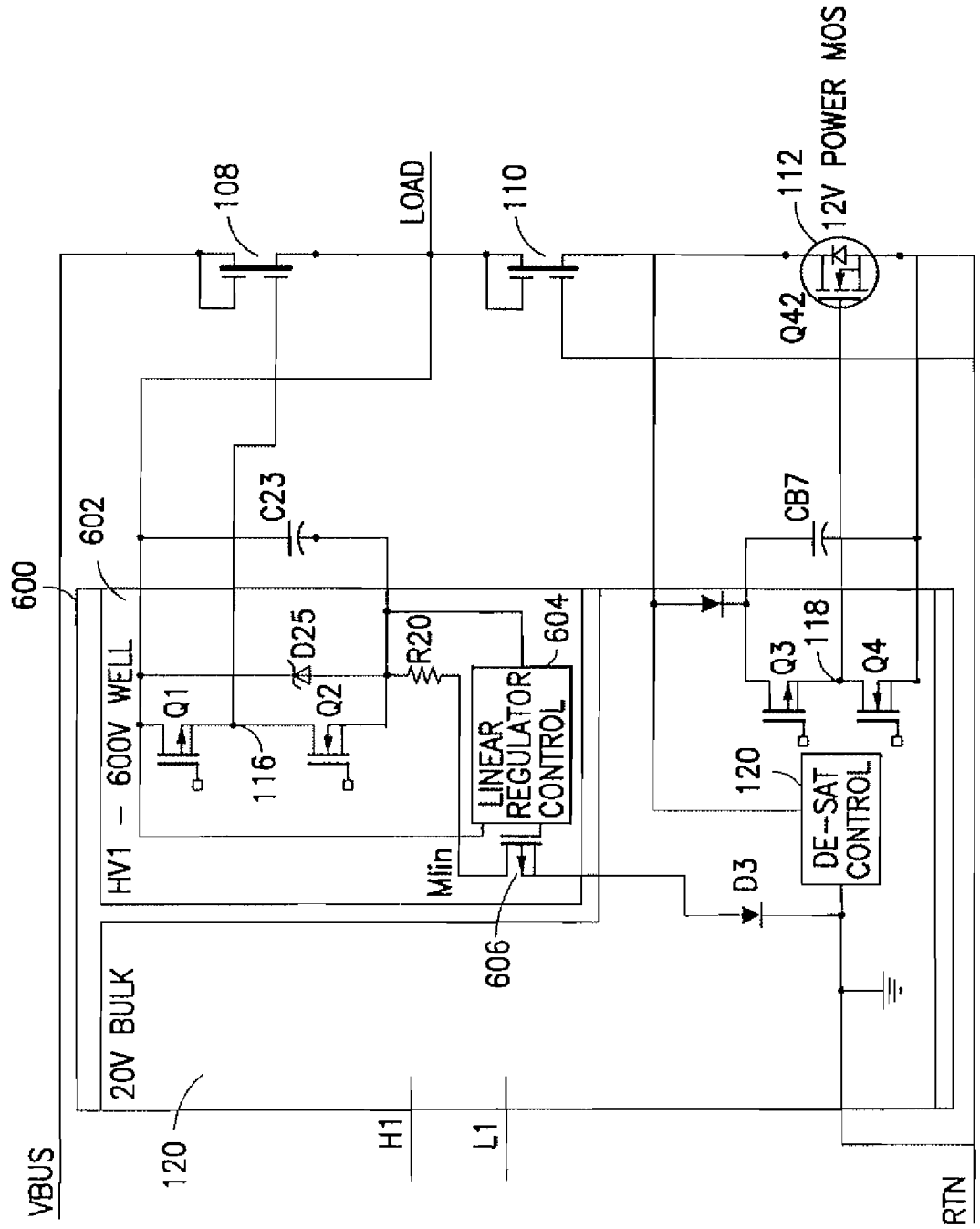
FIG. 6 illustrates a driving circuit for use with a half bridge circuit utilizing bidirectional switching devices in accordance with an embodiment of the present application.

FIG. 6 illustrates a second topology of a driving circuit for a half bridge utilizing bidirectional semiconductor switches in accordance with another embodiment of the present invention.

The circuit of FIG. 6 includes many common elements as that of FIG. 1 and thus common element will be referred to with common reference numerals.

As in FIG. 1, FIG. 6 illustrates two bidirectional semiconductor devices, specifically a high side switch 108 and a low side switch 110 are arranged in series between the positive DC bus rail (VBUS) and negative, or lower, DC bus rail, or return rail (RTN). The node 103 is provided between the high side and low side switches 108, 110 at the output of the half bridge which is preferably coupled to a load (not shown).

A driving circuit 600 is provide to control the switches 108 and 110 of the half bridge. In the particular embodiment illustrated in FIG. 6, the driving circuit is implemented as an integrated circuit (IC) formed on a 20V bulk substrate 102 and a single floating well (HV1) 602 which preferably has a 600V capacity and includes components for driving the high side switch 108.

The high side bidirectional switch 108 is preferably driven by a conventional output buffer formed by transistors Q1 and Q2 positioned in the first floating well 602. As illustrated, the node 116 is positioned between transistors Q1 and Q2 and is coupled to one of the gates of switch 108. The ON/OFF status of the transistors Q1 and Q2 is preferably determined based upon a high side input logic control signal HI which is connected to the circuit 100 via the bulk. It is noted that the IC circuit may also include appropriate level shifting and delay functions common to conventional driving circuits to ensure that the high side input logic control signal HI provide proper control.

In operation, the high side switch 108 is nominally ON and thus conducts to provide a voltage to the load via the output node 103 of the half bridge. During this time, the transistor Q2 is preferably OFF, and transistor Q1 is preferably ON. Thus no voltage is provided to the gate of the switch 108. The switch 108 remains ON since no voltage is applied to the gate connected to node 116 and the voltage at the other gate of the switch 108 is the same as that of the positive DC bus rail and thus no negative bias voltage applied either gate.

The linear regulator control device 604 is also preferably provided in the well 602 and monitors the voltage across the capacitor C23 and the status of the switch 108. The linear regulator control device 604 controls high voltage transistor 606 (Mlin) to power the output buffer formed by the transistors Q1 and Q2. As noted in FIG. 6, the high voltage transistor 606 (Mlin) is preferably a p-channel device. If the voltage across the capacitor C23 falls below a threshold level, for example, 12 volts in the specific circuit illustrated in FIG. 6, the transistor 606 is switched ON to ensure that there is a path to charge the capacitor C23 whether or not the switch 108 is ON. If the switch 108 is ON the transistor 606 is turned ON if the voltage across capacitor C23 is above the threshold voltage. If the voltage across capacitor C23 is above the threshold level, it may be an indication that the load voltage at node 103 is rising too high in which case it is preferable to turn switch 108 OFF. In conjunction with the high side input logic HI the low voltage of the return rail (RTN) is provided to the node 116 is provide via the transistor 606 and the transistor Q2, which is preferably turned ON bu the logic signal HI. The voltage at node 116 will be negative with respect to the high side rail and the output voltage, and thus will shut switch 108 OFF. As noted above when transistor Q1 is ON and transistor Q2 is OFF, no voltage is applied to the gate of switch 108 and the switch remains ON. Low voltage diode D3 may be provided in the linear regulator loop to help prevent the capacitor C23 from discharging when the high side switch 108 is OFF and low side switches 110 and 112 are ON.

As noted above with respect to FIG. 1 the low side logic input LI preferably is used to turn the low side switch 1100N and OFF as desired. The power MOSFET 112 may be placed in series between the switch 110 and the lower rail of the DC bus. The top gate of the switch 110 is coupled to the top electrode thereof, and thus will not provide a negative bias relative to the top electrode. The bottom gate of the switch 110 is coupled to the lower DC BUS rail, or return rail RTN. Thus, the potential applied to the lower gate will be substantially constant. However, the low side input logic LI is preferably used to control the output buffer formed by transistors Q3 and Q4. Appropriate level shifting and delays may be incorporated into the IC 600 to ensure that the low side input logic LI provides appropriate control. A node 118 is provided between the transistors Q3 and Q4 to provide a voltage to turn the power MOSFET 1120N and OFF. When the power MOSFET is ON, the relationship of the potential applied to the gates of switch 110 is such that the switch 110 stays on. When the power MOSFET 110 is turned OFF however, the voltage at the low side electrode of the switch 110 will change such that the switch 110 is turned OFF.

The desaturation control device 120 may also be provided to ensure that the power MOSFET 112 remains unsaturated. This feature is desirable in order to ensure that control of the power MOSFET will result in control of the lower switch 110.

The integrated circuit 600 of FIG. 6 eliminates the need for the external power supply 109 from FIG. 1 and also ensures safe start up and efficient voltage regulation by avoiding transient effects on the linear circuitry.

Figure 7:
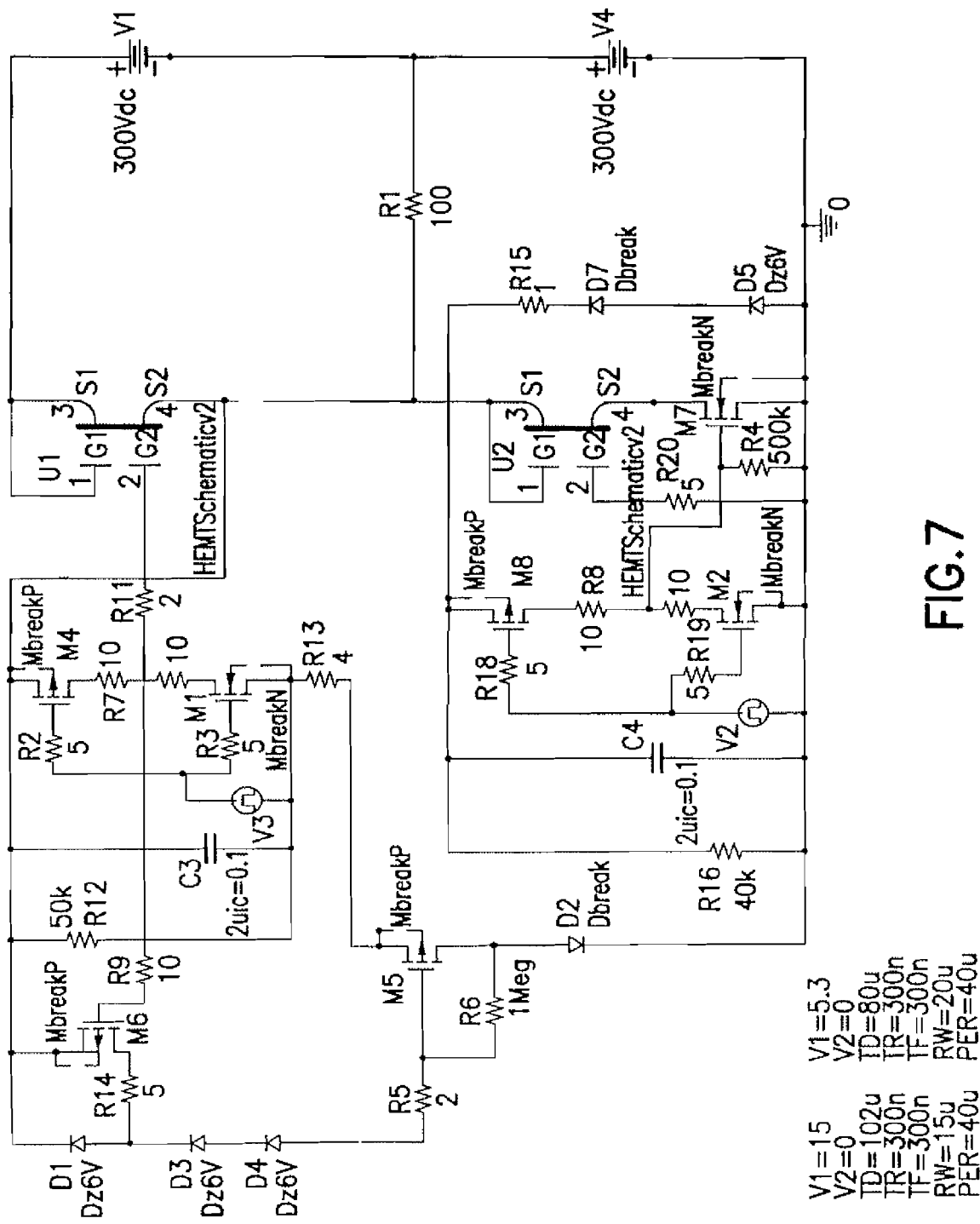
FIG. 7 illustrates a schematic of a simulation circuit used to simulate the circuit of FIG. 6.
Figure 8A:
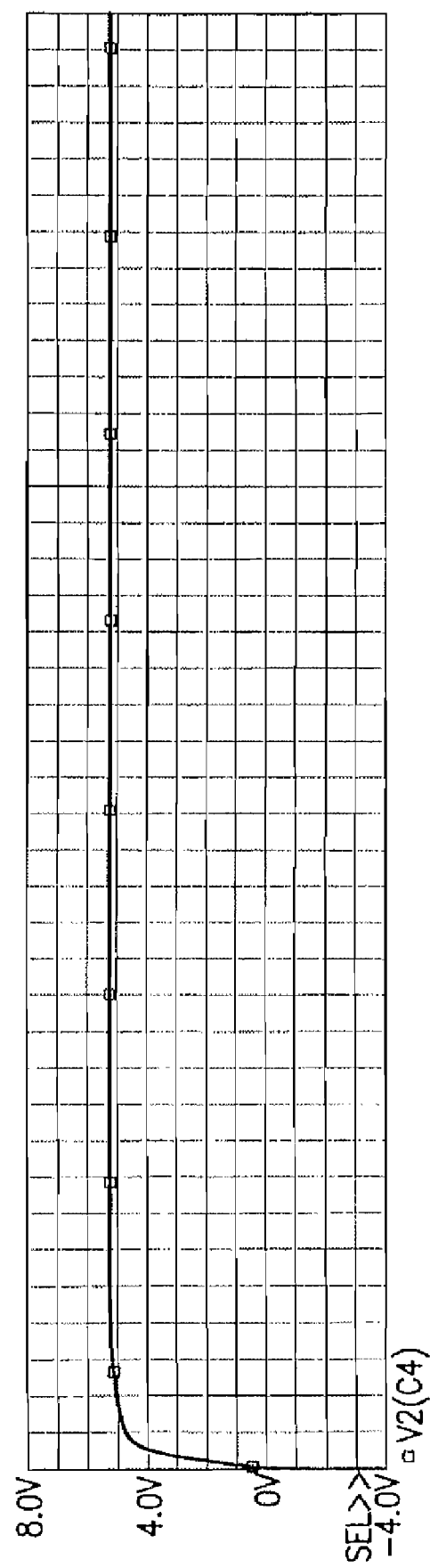
FIGS. 8A-8C are charts illustrating simulated values of various parameters in the circuit of FIG. 7.
Figure 8B:
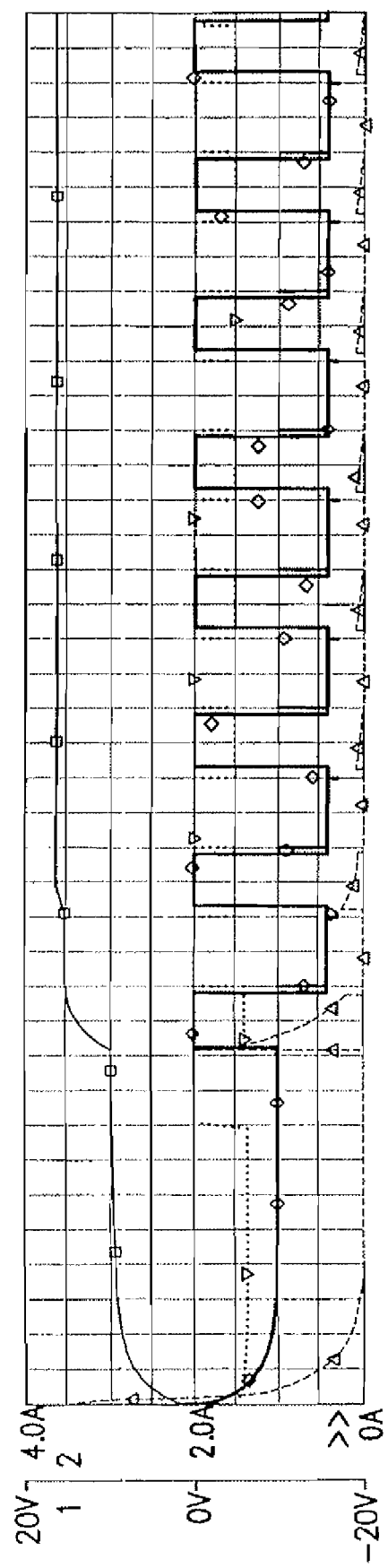
Figure 8C:
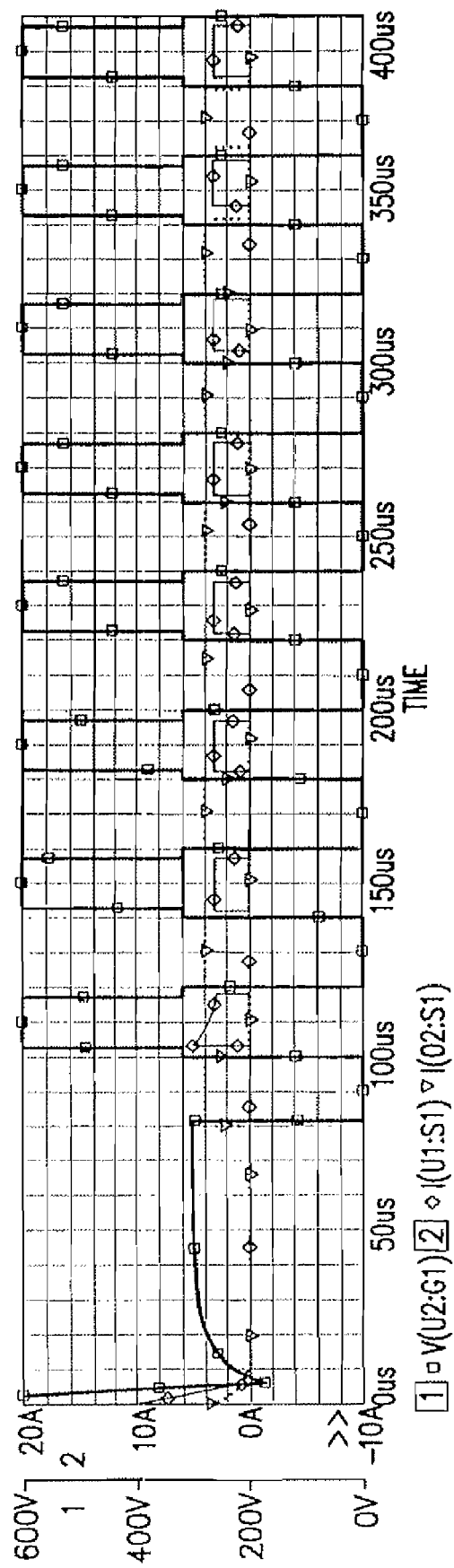

FIG. 7 is a schematic of a simulation circuit used in testing the circuit of FIG. 6. FIGS. 8A-8C are charts illustrating measured values of various parameters of the circuit of FIG. 7. As illustrated in FIG. 8A for example which is a graph of the output voltage V4, from start up the output voltage V4 rises smoothly to the desired value and then remains at the desired value.

Figure 9:
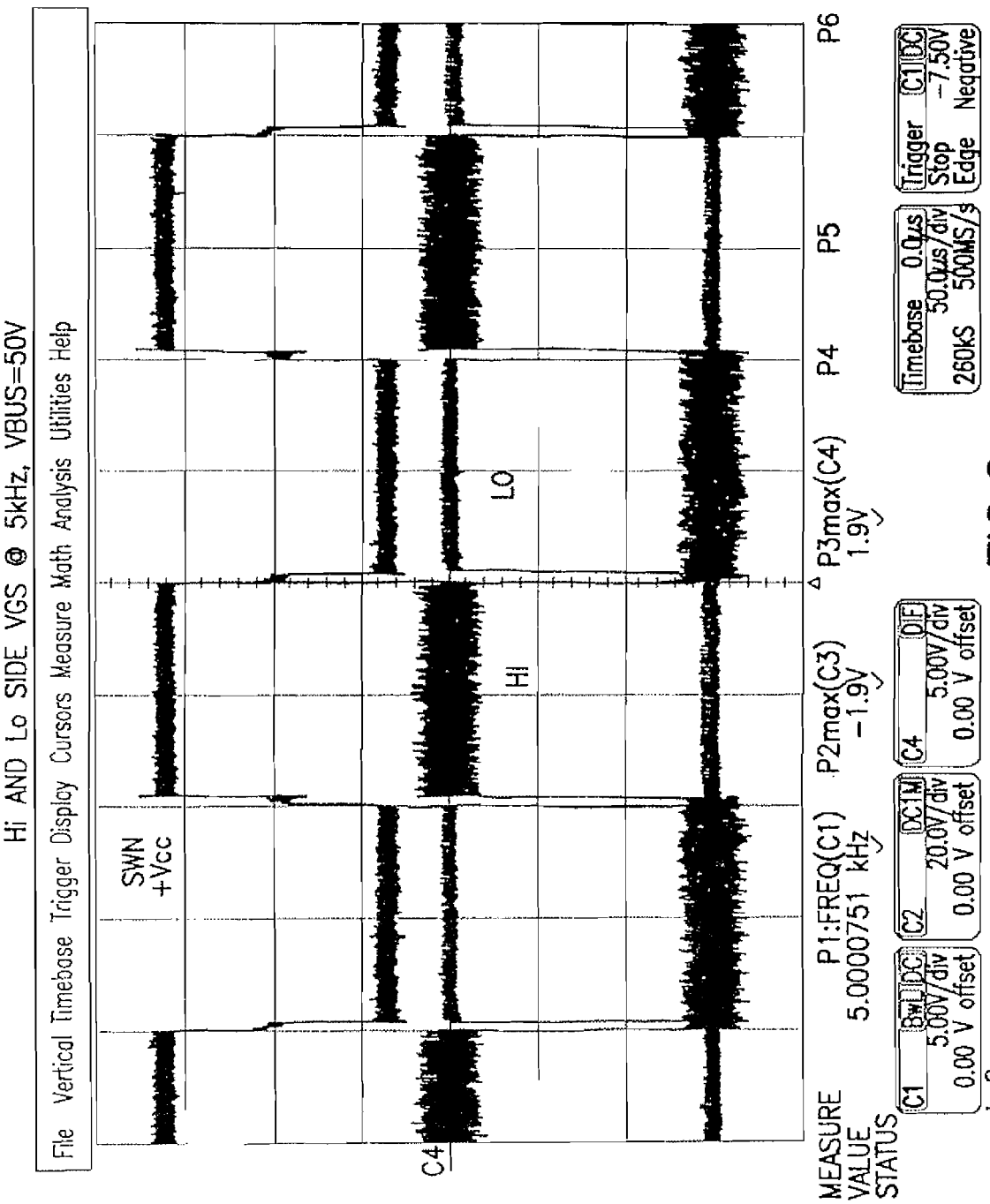
FIG. 9 is a chart illustrating measured values of the gate-source voltages of the switching devices in the simulation circuit of FIG. 7.

FIG. 9 is a chart illustrating the measured values of the gate-source voltages (VGS) for the high and low side switches of FIG. 7. As can be seen the gate-source voltages alternate between positive and negative values and thus are sufficient to turn the switches OFF when desired. In addition, the SWN of the circuit of FIG. 7 is illustrated.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A driving circuit comprising:
   a high side driver operable to control a high side depletion-mode semiconductor switch, wherein the high side driver provides a negative bias voltage to the high side depletion-mode semiconductor switch to turn the high side depletion-mode semiconductor switch OFF;
   a low side driver operable to control a low side depletion-mode semiconductor switch using cascoded switching;
   a negative supply switch operable to provide a negative supply voltage to the high side driver when the low side driver turns the low side depletion-mode semiconductor switch ON.

2. The driving circuit of claim 1, wherein the high side driver is controlled by a high side input control signal.

3. The driving circuit of claim 1, wherein the low side driver is controlled by a low side input control signal.

4. The driving circuit of claim 1, wherein the low side driver comprises:
   a first transistor;
   a second transistor, wherein the first and second transistors are positioned as a push-pull pair and are turned ON and OFF based on a low side input control signal controlling the low side driver;
   a power MOSFET in series with the low side depletion-mode semiconductor switch.

5. The driving circuit of claim 4, wherein the low side driver further comprises:
   an output node positioned between the first and second transistors and connected to a gate of the power MOSFET, wherein when the output node turns the power MOSFET ON, the low side depletion-mode semiconductor switch is ON and when the output node turns the power MOSFET OFF, the low side depletion-mode semiconductor switch is OFF.

6. The driving circuit of claim 4, wherein the low side driver further comprises a desaturation control device to prevent the power MOSFET to operate in saturation.

7. The driving circuit of claim 4, wherein the low side input control signal further controls the negative supply switch, such that the negative supply voltage is connected to the high side driver when the low side depletion-mode semiconductor switch is turned ON and wherein the negative supply voltage turns the high side depletion-mode semiconductor switch OFF.

8. A driving circuit comprising:
   a high side driver operable to control a high side depletion-mode semiconductor switch, wherein the high side driver includes a linear regulator control device that selectively connects the high side driver to a lower rail of a half bridge;
   a low side driver operable to control a low side depletion-mode semiconductor switch using cascoded switching.

9. The driving circuit of claim 8, further including a capacitor across the high side driver, wherein the linear regulator control device monitors the voltage across the capacitor and connects the high side driver to the lower rail of the half bridge responsive to a voltage across the capacitor.

10. The driving circuit of claim 9, wherein the linear regulator control device connects the high side driver to the lower rail of the half bridge when the voltage across the capacitor drops below the threshold value.

* * * * *